United States Patent
Agrawal et al.

(10) Patent No.: US 6,314,534 B1
(45) Date of Patent: Nov. 6, 2001

(54) GENERALIZED ADDRESS GENERATION FOR BIT REVERSED RANDOM INTERLEAVING

(75) Inventors: Avneesh Agrawal, Sunnyvale; Qiuzhen Zou, La Jolla, both of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/282,106

(22) Filed: Mar. 31, 1999

(51) Int. Cl.[7] .......................... G11C 29/00; H03M 13/00; H03M 13/03
(52) U.S. Cl. .......................... 714/702; 714/761; 714/762; 714/787; 714/788
(58) Field of Search ...................................... 714/701, 702

(56) References Cited

U.S. PATENT DOCUMENTS

| | | | |
|---|---|---|---|
| 4,394,642 | * 7/1983 | Currie et al. | 341/81 |
| 5,191,609 | 3/1993 | Mun | 380/14 |
| 5,327,239 | 7/1994 | Kim | 348/607 |
| 5,392,299 | * 2/1995 | Rhines et al. | 714/756 |
| 5,572,532 | * 11/1996 | Fimoff et al. | 714/702 |
| 5,898,698 | * 4/1999 | Bross | 714/701 |
| 6,064,664 | * 5/2000 | Kim | 370/335 |
| 6,101,465 | * 8/2000 | Sazzad et al. | 704/229 |

OTHER PUBLICATIONS

Hanan Herzberg, "Multilevel Turbo Coding with Short Interleavers", IEEE Journal on Selected Areas in Communications, vol. 16, No. 2, Feb. 1998.*

* cited by examiner

Primary Examiner—Albert DeCady
Assistant Examiner—Joseph D. Torres
(74) Attorney, Agent, or Firm—Philip R. Wadsworth; Charles D. Brown; Brian S. Edmonston

(57) ABSTRACT

A novel and improved method and apparatus for address generation in an interleaver is provided. In accordance with one embodiment of the invention, an address is generated using a random address fragment and a bit reversed address fragment. The bit reversed address fragment is selected by first generating two consecutive candidate bit reversed fragments. The second bit reversed address fragment is selected when the first bit reversed address fragment generates an address that is greater than a maximum address. The address generator allows address generation for interleaver and deinterleaver frame sizes of N, where N is not an integer power of two, without any cycle penalty.

8 Claims, 4 Drawing Sheets

TABLE 7.1.3.1.4.2.2.3.2-1. TURBO INTERLEAVERS OF SIZE $2^m = r \times c$

| ROW INDEX i | INT. SIZE: 128=8 X 16 | | INT. SIZE: 256=8 X 32 | | INT. SIZE: 512=16 X 32 | | INT. SIZE: 1024=16 X 64 | | INT. SIZE: 2048=32 X 64 | | INT. SIZE: 4096=32 X 128 | |
|---|---|---|---|---|---|---|---|---|---|---|---|---|
| | $i_b$ | $i_o$ | $i_b$ | $i_o$ | $i_b$ | $i_o$ | $i_b$ | $i_o$ | $i_b$ | $i_o$ | $i_b$ | $i_o$ |
| 0 | 13 | 1 | 18 | 22 | 11 | 3 | 26 | 19 | 29 | 50 | 11 | 11 |
| 1 | 2 | 8 | 5 | 8 | 8 | 28 | 17 | 28 | 55 | 20 | 89 | 20 |
| 2 | 14 | 6 | 1 | 4 | 18 | 22 | 26 | 60 | 32 | 13 | 3 | 82 |
| 3 | 8 | 14 | 12 | 15 | 2 | 27 | 34 | 6 | 38 | 15 | 33 | 120 |
| 4 | 13 | 12 | 24 | 13 | 5 | 11 | 25 | 60 | 17 | 51 | 2 | 105 |
| 5 | 4 | 5 | 23 | 25 | 8 | 12 | 58 | 38 | 20 | 37 | 71 | 69 |
| 6 | 13 | 6 | 16 | 27 | 9 | 14 | 41 | 5 | 34 | 50 | 73 | 23 |
| 7 | 14 | 9 | 16 | 30 | 8 | 7 | 25 | 40 | 4 | 24 | 70 | 87 |
| 8 | | | | | 24 | 9 | 32 | 55 | 32 | 36 | 64 | 72 |
| 9 | | | | | 14 | 16 | 26 | 31 | 8 | 0 | 95 | 73 |
| 10 | | | | | 28 | 6 | 38 | 16 | 31 | 25 | 14 | 36 |
| 11 | | | | | 11 | 17 | 50 | 28 | 61 | 37 | 108 | 102 |
| 12 | | | | | 9 | 2 | 23 | 46 | 62 | 38 | 21 | 64 |
| 13 | | | | | 3 | 24 | 22 | 40 | 25 | 27 | 67 | 109 |
| 14 | | | | | 2 | 3 | 55 | 32 | 10 | 41 | 14 | 42 |
| 15 | | | | | 11 | 14 | 19 | 21 | 43 | 51 | 106 | 27 |
| 16 | | | | | | | | | 37 | 5 | 63 | 64 |
| 17 | | | | | | | | | 10 | 43 | 17 | 13 |
| 18 | | | | | | | | | 41 | 54 | 65 | 5 |
| 19 | | | | | | | | | 26 | 4 | 62 | 46 |
| 20 | | | | | | | | | 10 | 44 | 116 | 111 |
| 21 | | | | | | | | | 40 | 19 | 12 | 68 |
| 22 | | | | | | | | | 17 | 26 | 65 | 48 |
| 23 | | | | | | | | | 44 | 60 | 53 | 3 |
| 24 | | | | | | | | | 16 | 23 | 66 | 60 |
| 25 | | | | | | | | | 19 | 39 | 47 | 90 |
| 26 | | | | | | | | | 38 | 58 | 126 | 59 |
| 27 | | | | | | | | | 47 | 54 | 115 | 1 |
| 28 | | | | | | | | | 13 | 38 | 113 | 38 |
| 29 | | | | | | | | | 46 | 7 | 12 | 9 |
| 30 | | | | | | | | | 46 | 22 | 57 | 75 |
| 31 | | | | | | | | | 17 | 13 | 55 | 6 |

FIG. 4

GENERALIZED ADDRESS GENERATION FOR BIT REVERSED RANDOM INTERLEAVING

BACKGROUND OF THE INVENTION

I. Field of the Invention

The present invention relates to communications. More particularly, the present invention relates to novel and improved method and apparatus generating memory addresses in an interleaver.

II. Description of the Related Art

Turbo coding is a very powerful form of forward error correction (FEC) coding. Forward error correction involves correcting errors in transmitted data. To perform error correction, the FEC coding is applied to the data before transmission. Once received, the original data is recovered from the received data using a decoding process. Providing this type of error correction allows successful transmission of data in noisy environments, and therefore facilitates various types of digital communication.

SUMMARY OF THE INVENTION

The present invention is a novel and improved method and apparatus for address generation in an interleaver. In accordance with one embodiment of the invention, an address is generated using a random address fragment and a bit reversed address fragment. A bit reversed address fragment is selected by first generating two consecutive candidate bit reversed fragments. A second bit interleaved fragment is selected when the first bit interleaved address fragment generates an address that is greater than a maximum address. The address generator allows address generation for interleaver and deinterleaver frame sizes of N, where N is not an integer power of two, without any cycle penalty.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 4 is a table of various sized interleavers.

DETAILED DESCRIPTION OF THE PREFERRED EMBODIMENTS

The present invention is a novel and improved method and apparatus for address generation in an interleaver. The invention may be used in various types of digital communications including satellite based digital communications systems and terrestrial based digital communication systems such as cellular telephone systems. Both such systems are "wireless" and use radio frequency electromagnetic signals to transmit other signals or data. Wireline systems may also use the invention. The invention is preferably implemented in an integrated circuit, however, the use of various other methods of implementing the invention will be apparent, including discrete or gate array logic or software running on a microprocessor. The various block diagrams used to describe the invention illustrate both hardware configuration and method steps.

Figure 1:
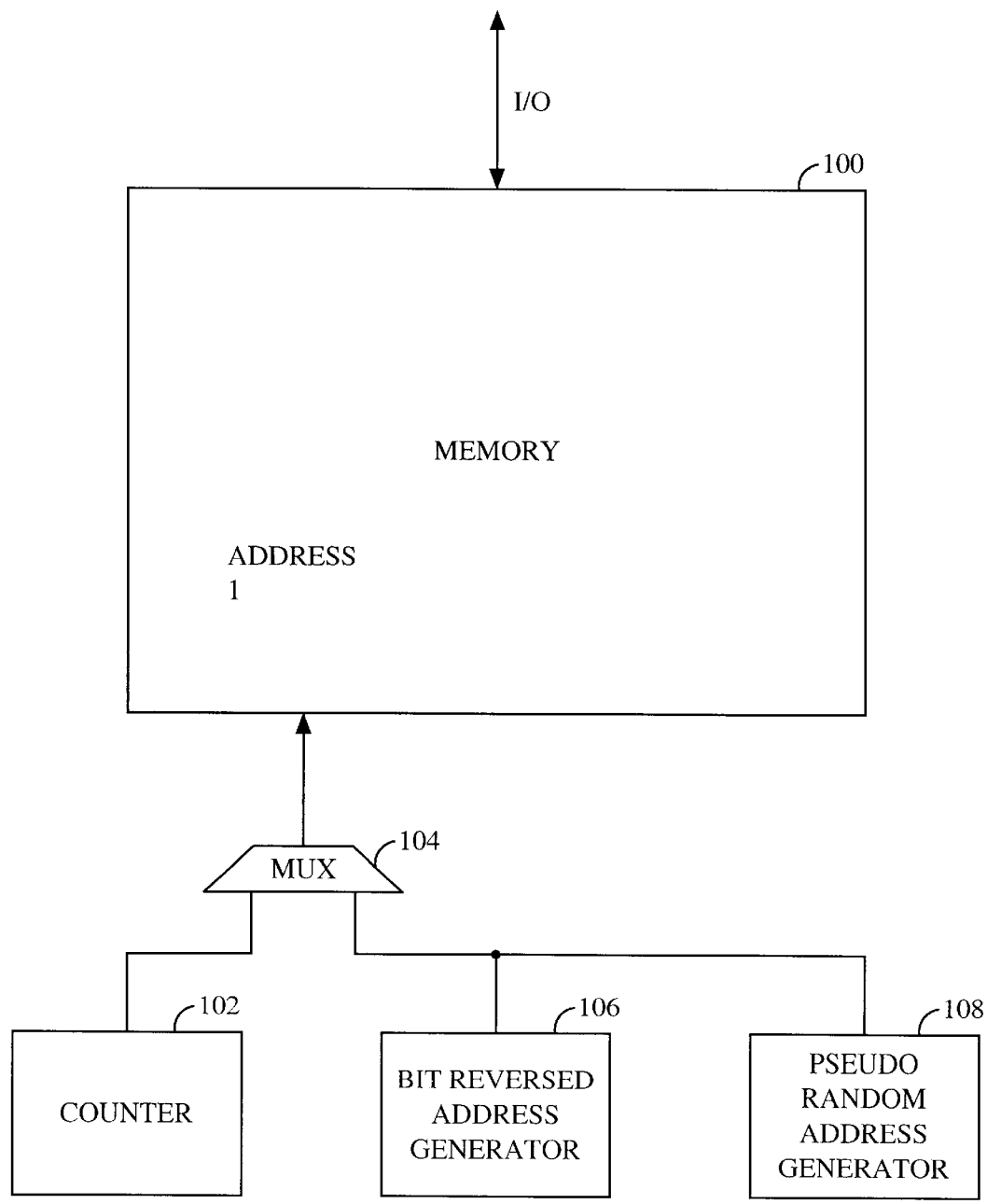
FIG. 1 is a block diagram of an interleaver.

FIG. 1 is a bock diagram of a generalized code interleaver configured in accordance with one embodiment of the invention. Code interleavers are distinguished from channel interleavers by their use within the transmit and receive processing chains. Typically, both code and channel interleavers are used in a system employing turbo coding. The described invention is preferably used within the code interleaver, because code interleavers are known to benefit from the use of pseudo-random address generation. The channel deinterleaver is typically located before the decoder in the transmit chain, and after the coder interleaver in the receive chain. Various turbo coding systems and interleavers are described in U.S. patent application Ser. No. 09/158,459 filed Sept. 22, 1998 entitled "Coding System Having State Machine Based Interleaver", and co-pending Continuation-In-Part Application Serial No. 09/172, 069, filed Oct. 13, 1998 entitled "Coding System Having State Machine Based Interleaver", and U.S. patent application Ser. No. 09/205, 511 filed Dec. 4, 1998 entitled "Turbo Code Interleaver Using Linear Cogruential Sequence", all assigned to the assignee of the present application and incorporated herein by reference.

Data (or symbols) to be interleaved are stored in interleaver memory 100. To perform practical pseudo-random interleaving suitable for turbocoding, many interleavers combine the use of bit reversal address generation with pseudo-random address generation. Deinterleavers are typically configured in a similar manner to interleavers, except the order in which the counter and interleaved addresses are applied is reversed.

During an exemplary processing, data is written into code interleaver memory using counter 102, applied through mux 104, as the address generator. When the data is read out, the address is generated by concatenating a bit reversed fragment and a pseudo-random fragment, which is also applied through mux 104. Bit-reversed address fragment generator 106 generates the bit reversed address fragment. Pseudo-random address fragment generator 108 generates the pseudo random address fragment. Pseudo-random address fragment generator may be, for example, a state machine. The two fragments are concatenated and applied to mux 104.

The two fragments may correspond to the row and the column of the memory, or vise-versa, but this is not necessary. By reading out data using an address generated by the described two address fragment generators, the data is output in a highly randomized fashion, and therefore interleaved, with respect to the order in which it is read in.

In the described embodiment of the invention, the pseudo-random address fragment forms the least significant portion of the address and the bit reversed fragment forms the most significant portion of the address. Various alternative methods for performing interleaving that use both pseudo-random and bit reversed address fragments are known, including those that incorporate additional steps in the address generation process. In general, these more complex alternative schemes will also benefit from the use of the invention.

Where the size of the block to be interleaved (the code interleaving block) is an inter power of two ($2^i$, where i is an integer value), the entire set of addresses generated by the concatenation of the two address fragments may be used. However, when the size of the code interleaver block is not an integer power of two (2), only a portion of the addresses generated may be used. In the context of a pseudo random address generator, unused addresses are typically "punctured" and therefore not used. If several addresses must be punctured in a row, however. there may not be enough clock cycles available to generate a suitable address.

The inability to generate addresses in a timely fashion may disrupt the operation of the circuit, require additional complexity, or necessitate high clock speeds which will increase power consumption or may not be feasible. In accordance with one aspect of the invention, an interleaver address generation unit is provided which ensures a proper address is generated during each clock cycle.

Figure 2:
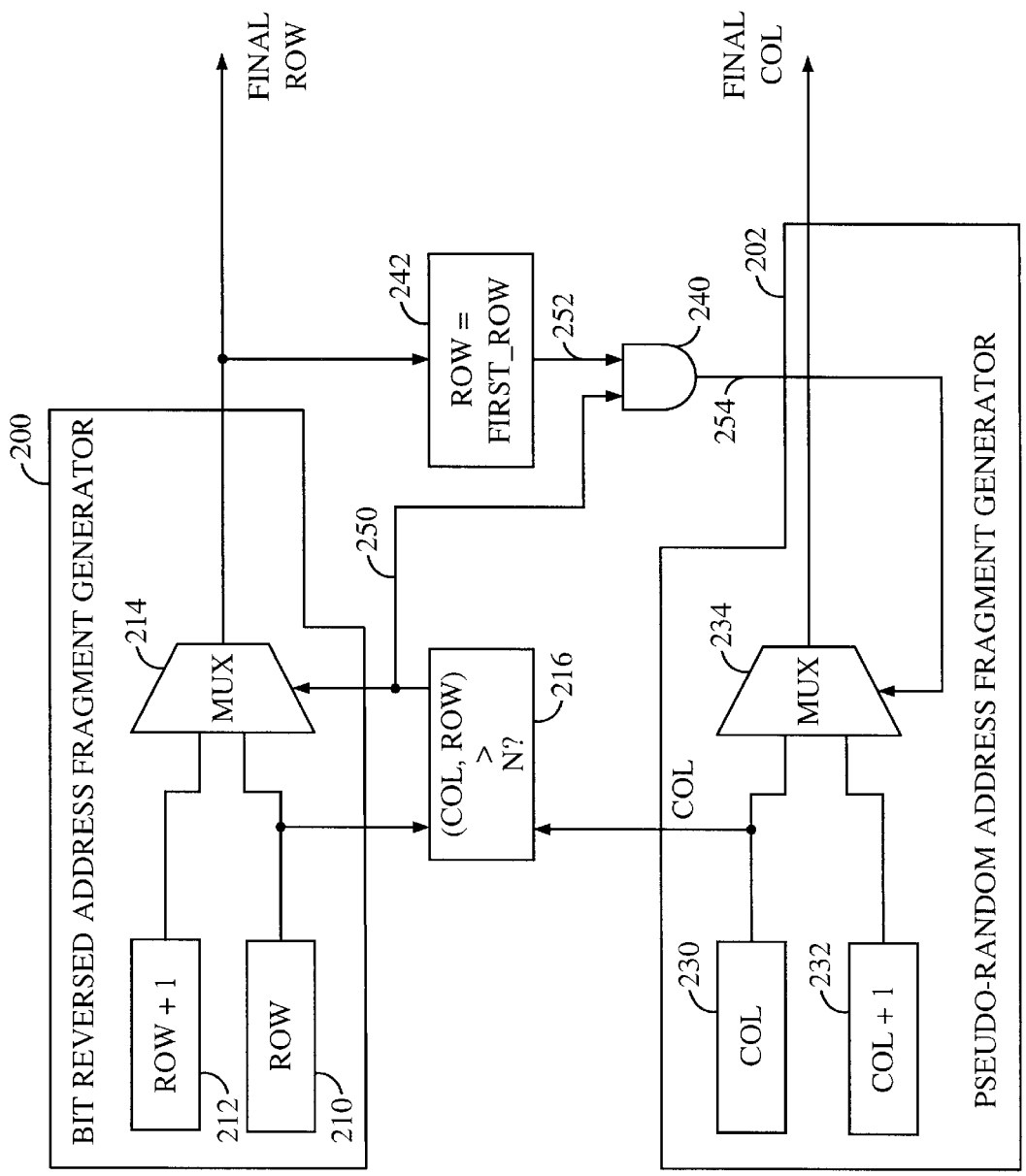
FIG. 2 is a block diagram of an address generator.

FIG. 2 is a block diagram of an address generation unit configured in accordance with one embodiment of the invention. The address generation unit includes a bit reversed address fragment generator 200 (used as the row generator in the exemplary embodiment, and also referred to as the row fragment generator for brevity) and the pseudo random address fragment generator 202 (used as the column generator in the exemplary embodiment and also referred to as the column fragment generator for brevity). The resulting address is formed by concatenating the bit reversed address fragment and the pseudo random address fragment.

Within bit reversed address fragment generator 200, row generator 210 generates a bit reversed row fragment for the current address. Row+1 generator 212 generates a next bit reversed row fragment for the next address. The current bit reversed address fragment from row generator 210 is applied to multiplexer 214 and to control circuit 216. The next bit reversed address fragment from row+1 generator 212 is also applied to multiplexer 214. Multiplexer 214 outputs the final row (the bit reversed address fragment ultimately used to generate the address).

Within pseudo-random address fragment generator 202, current column generator (col) 230 generates a current pseudo-random address fragment for the current address, which is applied to multiplexer 234. Additionally, the output of current column generator 230 is applied to control unit 216. Next column generator (col+1) 232 generates a next pseudo-random address fragment for the next address, which is applied to multiplexer 234. Multiplexer 234 outputs the final column (the pseudo-random address fragment ultimately used to generate the address). In the exemplary embodiment of the invention, the column and row fragments change during each address change.

During operation, control unit 216 receives the column and row for the current address and determines if the resulting address (the concatenation of the two fragments in the exemplary embodiment) is greater than N. N is the number of data bits, or symbols, in the code interleaver. In the exemplary embodiment, N is a non-integer power of two. That is, control unit 216 determines if the current address is greater than the size of the code interleaver block. If not, then control unit 216 causes multiplexer 214 to output the current row address from current row fragment generator 210.

If the current address is greater than N, however, and therefore out of range, control unit 216 causes multiplexer 214 to output the row fragment from row+1 generator 212. Thus, control unit 216 effectively "punctures" the current address when the current address is out of range. As described below, it can be ensured that if the current address is out of range, the next address will be in range, and therefore that a useable address will be available during the clock cycle.

In general, for N that is not an integer power of two, the number of bits in the address is large enough to address the next larger value that is an integer power of two. That is, the number of bits i in the address will be set such that $2^i$ is the next integer power of two greater than N, and that $2^{(i-1)}$ is next integer power of two that is less than N. Thus, the value of N will always be between $2^{(i-1)}$ and $2^{(i-1)}$. Therefore, any address that is out of range will nonetheless be greater than $2^{(i-1)}$, and will have its most significant bit set to logic zero.

This is because using rows of bit reversed addresses, the most significant bit of the two address fragments alternates between logic zero and logic one for each new address. That is, since the least significant bit becomes the most significant bit during bit reversal, the most significant bit in the bit reversed address increments each time. Thus, the most significant bit for the bit reversed address fragment alternates between logic one and logic zero, as does the least significant bit in an ordinary counter.

When the current address is out of range, the most significant bit of the next address will be logic zero. Therefore, the address will be less that $2^{(i-1)}$. Since $2^{(i-1)}$ is less than N, this next address is ensured to be in range, and therefore useable. Thus, by generating bit reversed address fragments for the current address and the next address it is ensured that at least one address will be in range and available during that clock cycle.

Within pseudo-random address fragment generator 202, current address column generator (col) 230 generates the pseudo random address fragment for the current address, which is applied to multiplexer 234 and control unit 216. Multiplexer 234 outputs the column value used to generate the address for interleaving or deinterleaving. Next column address generator (col+1) 232 generates the pseudo random address fragment for the next column, which is also applied to multiplexer 234. Preferably, the set of column address generated depends on the particular row to be processed, which increases the randomness of the interleaving.

Multiplexer 234 is controlled by the output of AND-gate 240, and outputs the final column value. AND-gate 240 receives the output of control unit 216 and control unit 242. Control unit 242 receives the final row value, that is generated by bit revered address fragment (the row generator).

During operation, control unit 216 receives the current row and current column values from the row and column fragment generators 200 and 202 and generates control signal 250 if the resulting address (as described above) is greater than N. Control unit 242 receives the final row from row fragment generator 200, and asserts control signal 252 when the row value received is equal to the first row processed for each column (FIRST_ROW). The FIRST_ROW is the first row fragment processed for each column, and in one embodiment is equal to all logic ones, which corresponds to the bit reversed value of all zeros.

As described above, when the current row and column are greater than N, control signal 250 is asserted and the next row is used. When the next row is equal to the FIRST_ROW, control signal 252 is asserted as well, causing AND-gate 240 to assert control signal 254. When control signal 252 and 254 are both asserted, this indicates that the result of the next row operation has caused the row address to cycle, and therefore generation of the next set of column address fragments begins. In order to allow this processing to begin on the next clock cycle, the next column address from column fragment generator 202 is used. Thus, the use of both a current column and a next column generator allow the deinterleaving to proceed rapidly and efficiently.

Some embodiments of the invention may omit the use of both a current and next column generators. Such embodiments of the invention still operate efficiently during the processing of a particular row, but some efficiency may be lost when the column switches over. For example, additional clock cycles may be necessary. It should also be understood that while current row generator and next row generator are shown as separate blocks or circuits, portions of the two units may share circuitry. Or, they may be the same units run at twice the clock speed. This is also true for the current column generator and the next column generator.

Figure 3:
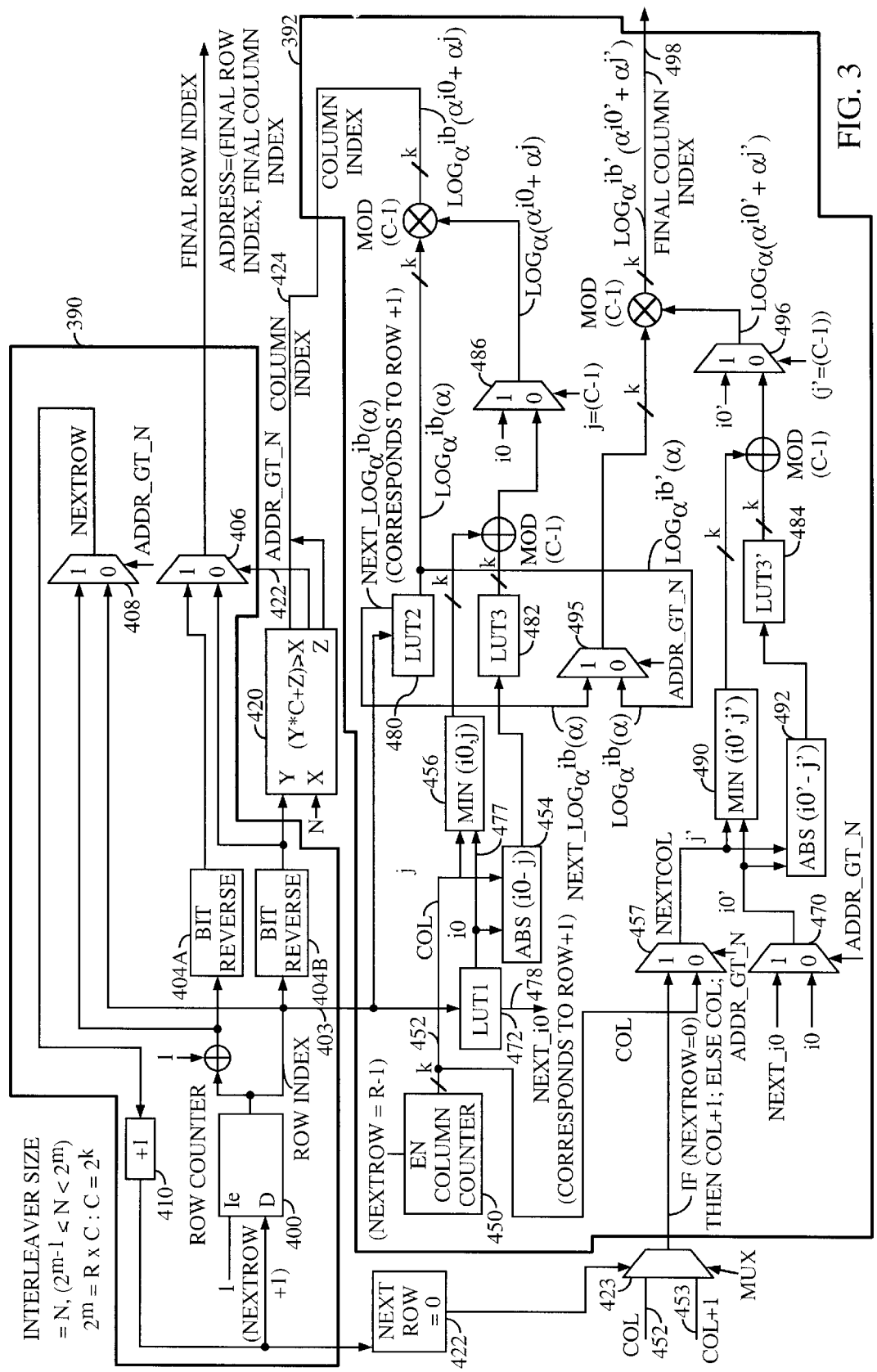
FIG. 3 is a block diagram of an address generator.

FIG. 3 is a block diagram of an address generation unit configured in accordance with the use of a Galios field (GF) pseudo random interleaver. In the exemplary embodiment, the GF interleaving is performed via the following steps.

For an interleaver of size N, a block of size $2^m$ is defined where $2^m = r \times c$ (r=rows and c=columns) and $2^m$ is the next integer power of 2 greater than or equal to N. Symbols to be transmitted are /1/ Written into the interleaver memory row by row.

/2/ Each row i (I=0,1, ..., r−1) is permutated according to the following rule:

$j \leftarrow \log_\alpha^{ib}(\alpha^{i0}+\alpha^j)$ for j=0,1,2,3, ..., c−2

$j \leftarrow \log_\alpha^{ib}(\alpha^{i0})$ for j=c−1 where $\alpha$ is a root of the primitive polynomial $p(x) \in GF(2)[x]$, used to construct GF(c). $\alpha^{ib}$ is a primitive element in GF(c) and $i_0$ is an integer between 0 and c−2, inclusive. The constants $i_b$ and $i_0$ are specific to each row, and a set of exemplary values for interleavers of various sizes are provided in FIG. 4. Furthermore, by definition $\log_\alpha^b(0) \equiv c-1$.

/3/ Re-order the rows according to the bit reversal on row index.

/4/ Read out the contents of the interleaver column by column.

Additionally, where the address generated using the both the bit reversed and calculated (pseudo random) address fragments as described above is greater than N, the address is punctured, and the next address used.

Still referring to FIG. 3, in this alternative embodiment of the invention the address generator includes bit reversed address fragment generator 390 and pseudo random address fragment generator 392. Additional control circuitry includes control unit 420, control unit 422 and multiplexer 423.

Within bit reversed address fragment generator 390, row counter 400 cycles from 0 to r−1, for the set of r rows in the interleaver memory. One copy of the value from row counter 400 is applied to bit reversal unit 404b, as well as multiplexer 408. Another copy of the value from row counter 400 is incremented by one by adder 402 and then applied to bit reversal unit 404a and multiplexer 408. The output of multiplexer 408 is incremented by add one circuit 410 and then applied as the input to row counter 400.

As should be apparent, bit reversal unit 404b generates a bit reversed address fragment for the current address, and bit reversal unit 404a generates a bit reversed address fragment for the next address. The current and next bit reversed address fragments are applied to multiplexer 406, which is control by Addr_GT_N signal 422 and which outputs the final row index used to generate the complete address. Additionally, the output of bit reversal unit 404b (the current row fragment) is applied to control unit 420. Control unit 420 also receives the value N, which is the number of bits or symbol being interleaved, and the column index 424 which is related to the current column being processed as described in greater detail below.

During operation, control unit 420 received the current bit reversal fragment, multiplies it by the number of columns c, and add the current column index 424. If the resulting value is greater than N, indicating the current address is out of range, control unit 420 assert Addr_GT_N signal 422. When Addr_GT_N is asserted multiplexer 406 outputs the next row address fragment as the final row. Additionally, multiplexer 406 outputs the next row index value (the unreversed next row value) which is used to generate the current row and next row during the next cycle. Thus, bit reversed address fragment generator 390 generates a row address that is in range during each clock cycle by generating both current and next address rows and selecting the row that generates an in range address.

Within pseudo random address fragment generator 392 column counter 450 generates a current column index 452. Current column index 452 is supplied to Abs($i_0$−j) circuit 454, MIN($i_0$,j) circuit 456 and multiplexer 457. Additionally, current column index 424 is applied to multiplexer 423 although the connection is not shown for ease of drawing. A next column index (Col+1) is also generated using current column index 424 and is applied to mux 423. The output of multiplexer 423 is applied to multiplexer 457.

Look up table one (LUT1) 472 receives the current row index 403 from row address generator 390 and generates i0 477 and Next_i0 478, which corresponds to the value $i_0$ for the next row (row+1). Look up table two (LUT2) 480 also receives the current row index 403 and generates $\log_{\alpha ib}(\alpha)$ and Next_$\log_\alpha^{ib}(\alpha)$. The term $\log_\alpha^{ib}(\alpha)$ corresponds to the value $\log_\alpha^{ib}(\alpha)$ for the current row index. The term Next $\log_\alpha^{ib}(\alpha)$ corresponds to the value $\log_\alpha^{ib}(\alpha)$ for the next row index. Look up table three (LUT3) 482 and Look up table three prime (LUT3') 484 generate values X+1, where X is an element of GF(c). LUT3 is controlled by the output of Abs(i0−j) circuit 454 LUT3' 484 is controlled by the output of Abs(i0'−j') circuit 492.

The output of LUT3 482 is modulo added with the output of MIN(i0,j) circuit 456 and the result applied to multiplexer 486. Multiplexer 486 also receives i0 from LUTE 472. The output of multiplexer 486 is multiplied by the value $\log_\alpha^{ib}(\alpha)$ from LUT2 480 generating current column index 424 which corresponds to the value $\log_\alpha^{ib}(\alpha^{i0+j})$.

Similarly, the output of LUT3' 484 is modulo added with the output of MIN(i0,j) circuit 490 and the result applied to multiplexer 496. Multiplexer 486 also receives i0' from multiplexer 470. The output of multiplexer 496 is multiplied by the value $\log_\alpha^{ib}(\alpha)$ from LUT2 480 generating final column index 424 which corresponds to the value $\log_\alpha^{ib'}(\alpha^{i'0}+\alpha^{j'})$ FIG. 4 provides an exemplary list of $i_b$ and $i_0$ for various sized interleavers in accordance with one embodiment of the invention.

Referring again to FIG. 3, during operation, multiplexer 423 provides either the current column 452 or the next column 453 based on the output of NextRow=0 circuit 422. As described above, NextRow=0 circuit asserts a signal when the next row is equal to zero, and therefore the first row processed for each column in the exemplary embodiment. Multiplexer 457 receives one copy of the current column 452, and the output of Multiplexer 423. The result is that if Addr_GT_N signal 422 is asserted (indicating the a row has been punctured) and the resulting next row is the first row in a column, the next column (col+1) value is output from multiplexer 457.

When the next column is output from multiplexer 457, the remaining circuitry generates a final column index 498 (the column address fragment) that corresponds to the next column index. The system generates the current column index and determines, using that index, if the processing of the corresponding set of rows is complete. If so, the value for the next column index is calculated. Thus, the proper column index is generated without the need for an additional clock cycle.

If a row index is punctured, but the column index remains the same, Addr_GT_N 422 causes multiplexers 470, and 495 to output the next row value of the associated set of input values. Additionally, multiplexers 486 and 496 cause the i0 value to be used when j=c−1 to implement the processing steps described above. The resulting final row index and final column index are concatenated to generate the address used for interleaving or deinterleaving.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. An interleaver, having a size N where N is not an integer power of two, comprising:

means for generating a current bit reversed address fragment;

means for generating a next bit reversed address fragment;

means for generating a pseudo random address fragment;

means for generating a next pseudo random address fragment; and a control unit that selects:

the current bit reversed address fragment when an address made of the current bit reversed address fragment and the pseudo random address fragment is not greater than N, the next bit reversed address fragment when greater than N, and the next pseudo random address fragment when the next bit reversed address fragment is identified as being a first address in a bit reversed address fragment series.

2. The interleaver as set forth in claim 1, wherein the pseudo random address fragment generator means is a Galios field based state machine.

3. An interleaver, having a size N where N is not an integer power of two, comprising:

means for generating a current bit reversed address fragment;

means for generating a next bit reversed address fragment;

means for generating a pseudo random address fragment; and a control unit that selects:

the current bit reversed address fragment when an address made of the current bit reversed address fragment and the pseudo random address fragment is not greater than N, and the next bit reversed address fragment when greater than N, the current bit reversed address fragment and the next bit reversed address fragment being generated during a single clock cycle.

4. A method for interleaving a block of data having a size N, where N is not an integer power of two, comprising:

generating a current bit reversed address fragment, a next bit reversed address fragment, and a pseudo random address fragment, at least the current bit reversed address fragment and the next bit reversed address fragment being generated during a single clock cycle;

selecting the current bit reversed address fragment when an address made of the current bit reversed address fragment and the pseudo random address fragment is not greater than N; and selecting the next bit reversed address fragment when the address is greater than N.

5. The method as set forth in claim 4, wherein the pseudo random address fragment is generated by:

calculating j for each bit reversed address, where j is equal to $$j \leftarrow \log_{\alpha_{i_b}}(\alpha^{i_0+\alpha_j}) \text{ for } j=0,1,2,3,\ldots,c-2$$

$$j \leftarrow \log_{\alpha_{i_b}}(\alpha^{i_0}) \text{ for } j=c-1$$

where $\alpha$ is a root of the primitive polynomial p(x) $\in$GF(2), used to construct GF(c). $\alpha^\beta$ is a primitive element in GF(c) and $i_0$ is an integer between 0 and c−2, inclusive, and $i_b$ and $i_0$ are specific to each row.

6. The method as set forth in claim 4, further comprising generating a next pseudo random address fragment.

7. The method as set forth in claim 6, further comprising selecting the next pseudo random address fragment when the next bit reversed address fragment is identified as being a first address in a bit reversed address fragment series.

8. The method as set forth in claim 4, wherein the pseudo random address fragment is generated according to a Galios field operation.

* * * * *